(12) United States Patent
Cai

(10) Patent No.: US 11,782,114 B1
(45) Date of Patent: Oct. 10, 2023

(54) REDUCING ARTIFACT GENERATION ECHO IN STIMULATED-ECHO-BASED STRAIN IMAGING

(71) Applicant: Siemens Healthcare GmbH, Erlangen (DE)

(72) Inventor: Xiaoying Cai, Brookline, MA (US)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/811,126

(22) Filed: Jul. 7, 2022

(51) Int. Cl.
*G01R 33/565* (2006.01)
*G01R 33/56* (2006.01)

(52) U.S. Cl.
CPC ....... *G01R 33/565* (2013.01); *G01R 33/5608* (2013.01)

(58) Field of Classification Search
CPC .......................... G01R 33/5608; G01R 33/565
See application file for complete search history.

(56) References Cited

U.S. PATENT DOCUMENTS

| 10,830,855 B2 * | 11/2020 | Cai | G06T 7/20 |
| 10,955,508 B2 * | 3/2021 | Fuderer | G01R 33/56536 |
| 2017/0131374 A1 * | 5/2017 | Choi | G01R 33/4828 |

OTHER PUBLICATIONS

Smiseth et al., "Myocardial Strain Imaging: How Useful is it in Clinical Decision Making?" European Heart Journal, 2016, pp. 1196-1207.
Young, Alistair A. et al: "Validation of Tagging with MR Imaging to Estimate Material Deformation" in: Cardiac Radiology 188.1 (1993): pp. 101-108.
Kim et al, "Myocardial Tissue Tracking With Two-Dimensional Cine Displacement-Encoded MR Imaging: Development And Initial Evaluation"; In Radiology, vol. 230, No. 3, 2004 (pp. 862-871).
Osman et al., "Imaging Longitudinal Cardiac Strain on Short-Axis Images Using Strain-Encoded MRI", Magnetic Resonance in Medicine 46, 2001, pp. 324-334.
Pan, Li, et al. "Real-time imaging of regional myocardial function using fast-SENC." Magnetic Resonance in Medicine: An Official Journal of the International Society for Magnetic Resonance in Medicine 55.2 (2006): 386-395.
Scott, Andrew D., et al. "Accelerating cine DENSE using a zonal excitation." Journal of Cardiovascular Magnetic Resonance 18.1 (2016): 1-3.

(Continued)

*Primary Examiner* — Gregory H Curran

(57) ABSTRACT

A method for reducing artifact generation echo in stimulated-echo-based strain imaging using magnetic resonance imaging (MRI) includes determining an inhomogeneity direction, determining an encoding direction, adjusting the encoding direction to correspond with the inhomogeneity direction, and capturing, via an MRI system, a magnetic resonance image of the anatomical object at an imaging location when the encoding direction corresponds with the inhomogeneity direction. The inhomogeneity direction is the direction of a local inhomogeneity of a magnetic field at the imaging location of an anatomical object. The encoding direction is the direction of an encoding gradient of a magnetic field of the MRI system.

20 Claims, 7 Drawing Sheets

(56) References Cited

OTHER PUBLICATIONS

Zhong, Xiaodong, et al. "Selective suppression of artifact-generating echoes in cine DENSE using through-plane dephasing." Magnetic Resonance in Medicine: An Official Journal of the International Society for Magnetic Resonance in Medicine 56.5 (2006): 1126-1131.

Starck G. et al.: "K-Space analysis of point-resolved spectroscopy (PRESS) with regard to spurious echoes in in vivo 1H MRS"; in NMR Biomed; vol. 22; pp. 137-147.

* cited by examiner

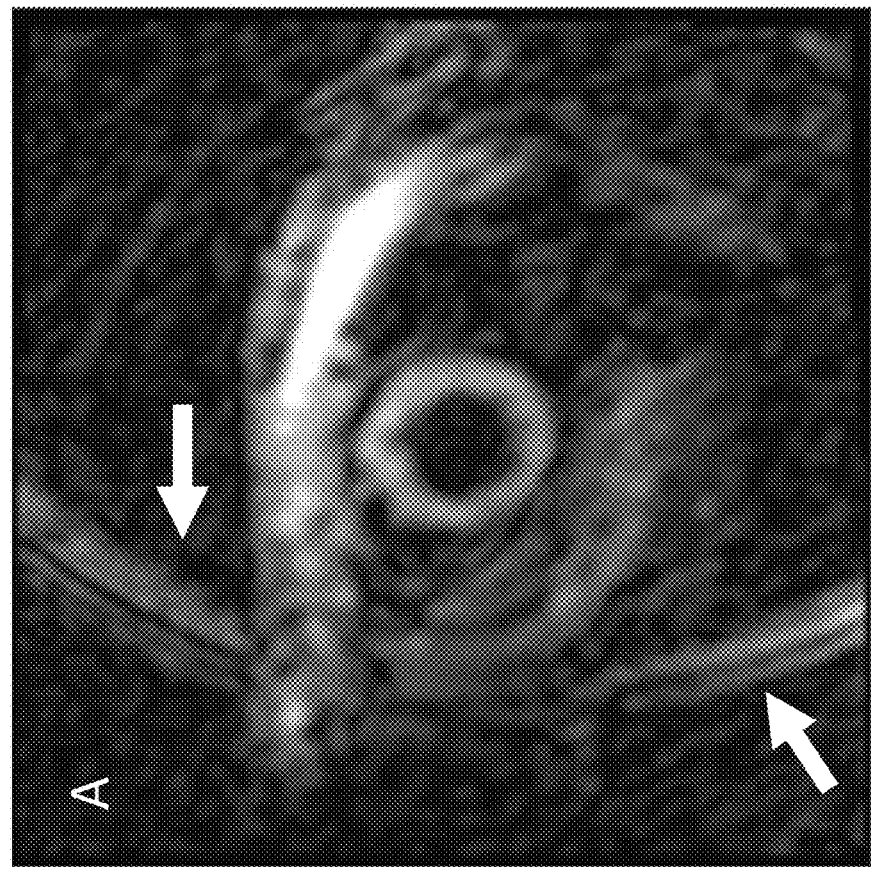
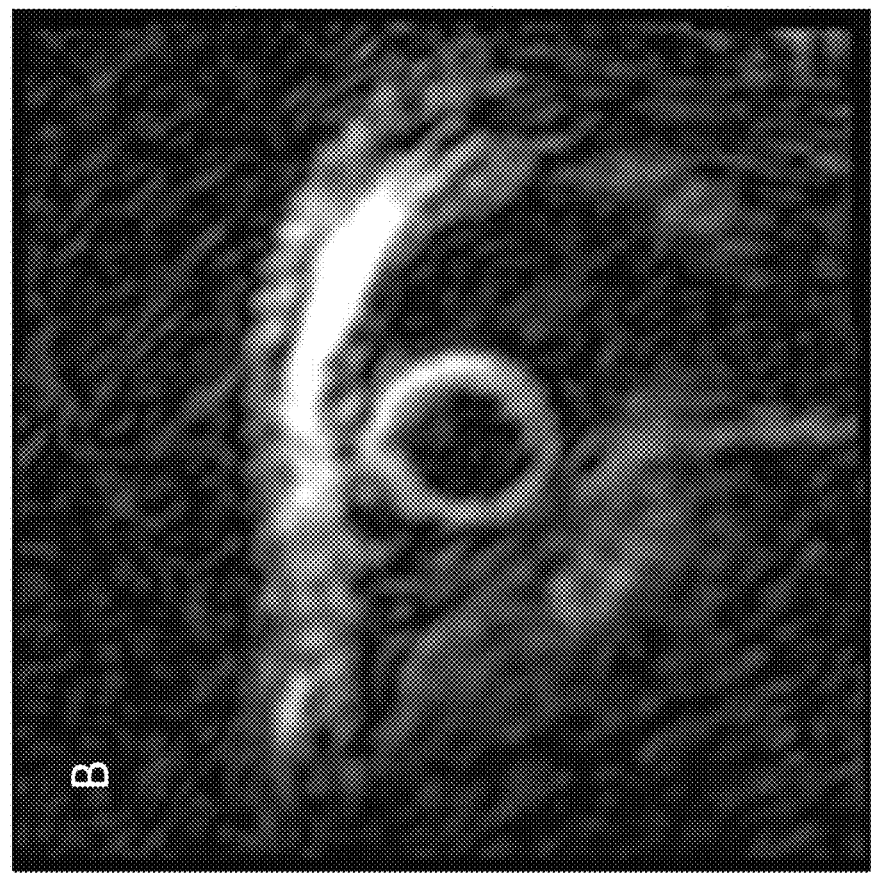
FIG. 1

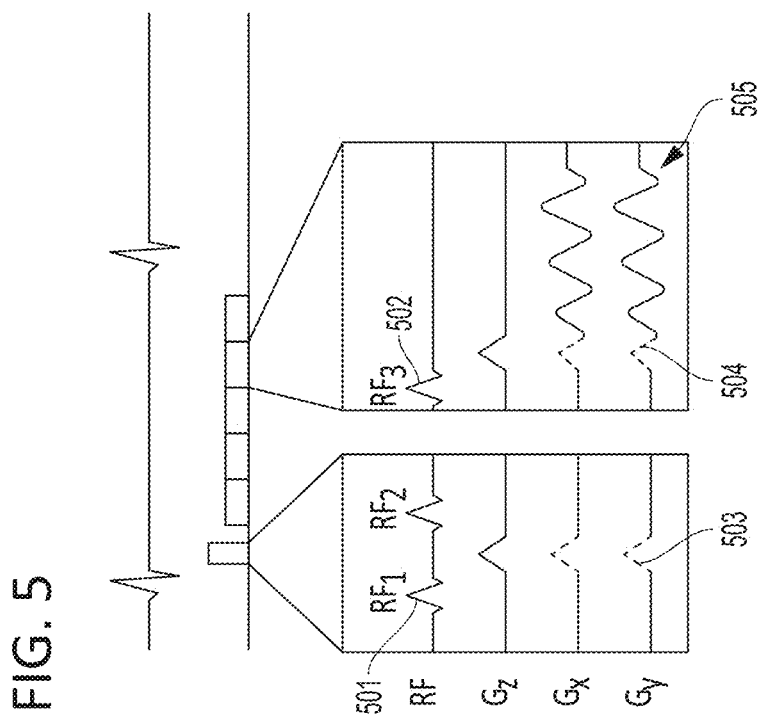

WITH THROUGH-PLANE DEPHASING OR THROUGH-PLANE ENCODING

WITH LOCAL INHOMOGENEITY

WITH LOCAL INHOMOGENEITY WITH THE ENCODING GRADIENT NEGATED

WITHOUT LOCAL
INHOMOGENEITY

WITH LOCAL
INHOMOGENEITY

WITH LOCAL INHOMOGENEITY
WITH THE ENCODING GRADIENT NEGATED
IN THE X-DIRECTION

REDUCING ARTIFACT GENERATION ECHO IN STIMULATED-ECHO-BASED STRAIN IMAGING

TECHNICAL FIELD

The present invention relates generally to cardiovascular magnetic resonance imaging and, more particularly, reducing the artifact generation echo in stimulated-echo-based strain imaging.

BACKGROUND

Magnetic resonance ("MR") imaging can be used to measure function and tissue characteristics of the heart and myocardium. Measurements include left ventricular ejection fraction, T1/T2 mapping and strain. Methods of MR strain imaging include the displacement encoded stimulated echo imaging (DENSE) and strain-encoded imaging (SENC). Both of these imaging methods utilize a stimulated echo generated by three radiofrequency pulses.

Methods utilizing a stimulated echo produce a T1-relaxation echo that can generate artifacts in the resulting image. Current methods exist to minimize the artifacts generated by the T1-relaxation echo. For example, when using the DENSE method, the T1-relaxation echo can be canceled out by taking two acquisitions, each with a different phase, and subtracting one acquisition from the other. The T1-relaxation echo could also be reduced by applying a through-plane dephasing gradients. When using the SENC method, the T1-relaxation echo theoretically does not overlap with the imaging echo in the direction perpendicular to the imaging plane with the application of the through-plane encoding gradient for strain encoding.

Although methods exist to minimize the artifacts generated by the T1-relaxation echo, these methods may not work well if there is motion. Further, the prior methods may not work well in the presence of a strong local field inhomogeneity.

The present disclosure is directed to overcoming these and other problems of the prior art.

SUMMARY

Embodiments of the present disclosure address and overcome one or more of the above shortcomings and drawbacks by providing systems, methods, and articles of manufacture related to reducing artifact generation echo in stimulated-echo-based strain imaging by adapting the direction of the encoding gradients based on prior knowledge of local inhomogeneity.

In one general aspect, the present disclosure is directed to a method for reducing artifact generation echo in stimulated-echo-based strain imaging using magnetic resonance imaging (MRI). In an embodiment, the method comprises determining an inhomogeneity direction, determining an encoding direction, adjusting the encoding direction to correspond with the inhomogeneity direction, and capturing, via the MRI system, a magnetic resonance image of the anatomical object at the imaging location when the encoding direction corresponds with the inhomogeneity direction. The inhomogeneity direction is a direction of a local inhomogeneity of a magnetic field at an imaging location of an anatomical object. The encoding direction is a direction of an encoding gradient.

Various enhancements, refinements, and other modifications can be made to the aforementioned method in different embodiments. For example, in some embodiments, determining the inhomogeneity direction comprises acquiring a field map of the imaging location. In some embodiments, the anatomical object is a heart. In some embodiments, the method further comprises calculating strain of the anatomical object at the imaging location using the magnetic resonance image. In other embodiments, the method further comprises calculating strain of the anatomical object at the imaging location using the magnetic resonance image and displacement encoded stimulated imaging. In yet other embodiments, the method further comprises calculating strain of the anatomical object at the imaging location using the magnetic resonance image and strain-encoded imaging.

In another general aspect, the present disclosure is directed to a system for reducing artifact generation echo in stimulated-echo-based strain imaging using MRI. In an embodiment, the system comprises an MRI system and one or more computers. The MRI system may be configured to capture a magnetic resonance image of the anatomical object at the imaging location when the encoding direction corresponds with the inhomogeneity direction. The one or more computers may be configured to determine the inhomogeneity direction, determine the encoding direction, and adjust the encoding direction to correspond with the inhomogeneity direction. The inhomogeneity direction may be the direction of a local inhomogeneity of a magnetic field at an imaging location of an anatomical object. The encoding direction is the direction of an encoding gradient.

Various enhancements, refinements, and other modifications can be made to the aforementioned system in different embodiments. For example, in some embodiments, the determining the inhomogeneity direction comprises acquiring a field map of the imaging location. In some embodiments, the MRI system comprises a magnetic field having a local inhomogeneity at the imaging location. In some embodiments, the local inhomogeneity is caused by the anatomical object. In some embodiments, the anatomical object is a heart. In some embodiments, the one or more computers are further configured to calculate the strain of the anatomical object at the imaging location using the magnetic resonance image. In other embodiments, the one or more computers are further configured to calculate the strain of the anatomical object at the imaging location using the magnetic resonance image and displacement encoded stimulated imaging. In yet other embodiments, the one or more computers are further configured to calculate the strain of the anatomical object at the imaging location using the magnetic resonance image and strain-encoded imaging.

In another general aspect, the present disclosure is directed to an article of manufacture for reducing artifact generation echo in stimulated-echo-based strain imaging using magnetic resonance. The article of manufacture comprises a non-transitory, tangible computer-readable medium holding computer-executable instructions for performing a method. The method comprises determining the inhomogeneity direction, determining the encoding direction, adjusting the encoding direction to correspond with the inhomogeneity direction, and using the MRI system to capture a magnetic resonance image of the anatomical object at the imaging location when the encoding direction corresponds with the inhomogeneity direction. The inhomogeneity direction is the direction of a local inhomogeneity of a magnetic field at an imaging location of an anatomical object. The encoding direction is the direction of an encoding gradient.

Various enhancements, refinements, and other modifications can be made to the aforementioned article of manufacture in different embodiments. For example, in some embodiments, the determining the inhomogeneity direction comprises acquiring a field map of the imaging location. In some embodiments, the anatomical object is a heart. In some embodiments, the method further comprises calculating the strain of the anatomical object at the imaging location using the magnetic resonance image. In some embodiments, the method further comprises calculating the strain of the anatomical object at the imaging location using the magnetic resonance image and displacement encoded stimulated imaging. In yet other embodiments, the method further comprises calculating the strain of the anatomical object at the imaging location using the magnetic resonance image and strain-encoded imaging.

BRIEF DESCRIPTION OF THE DRAWINGS

The accompanying drawings, which are incorporated in and form a part of the specification, illustrate embodiments of the disclosed subject matter and, together with the written description, serve to explain the principles, characteristics, and features of the disclosed subject matter.

FIG. 1 are figures of strain-encoded imaging with opposite directions of the through-plane encoding gradients, demonstrating the impact of the gradient direction on image quality.

FIG. 5 is a sequence diagram of 2D cine DENSE- or SENC-based strain encoding.

DETAILED DESCRIPTION

This disclosure is not limited to the particular systems, devices, and methods described, as these may vary. The terminology used in the description is for the purpose of describing the particular versions or embodiments only and is not intended to limit the scope.

As used in this document, the singular forms "a," "an," and "the" include plural references unless the context clearly dictates otherwise. Unless defined otherwise, all technical and scientific terms used herein have the same meanings as commonly understood by one of ordinary skill in the art. Nothing in this disclosure is to be construed as an admission that the embodiments described in this disclosure are not entitled to antedate such disclosure by virtue of prior invention. As used in this document, the term "comprising" means "including, but not limited to."

The present disclosure describes systems, methods, and articles of manufacture related to reducing artifact generation echo in stimulated-echo-based strain imaging by adapting the direction of the encoding gradients based on the local inhomogeneity of the magnetic field, which optimizes suppression of the T1b-relaxation echoes. In certain instances, the terms "local gradient" and "local inhomogeneity" refer to the same property.

Myocardial strain imaging is a method to quantify cardiac function known in the art. Several techniques of myocardial strain imaging using MR are known in the art, including tagging, displacement-encoded stimulated-echo (DENSE), and strain-encoded imaging (SENC).

FIG. 5 is a sequence diagram of 2D cine DENSE- or SENC-based strain encoding. Through-plane dephasing gradient or through-plane encoding/un-encoding gradients are shown as 501 and 502. Displacement encoding gradients and un-encoding gradient are shown as 503 and 504, respectively. The displacement encoding gradients 503 and the un-encoding gradient 504 are used in DENSE, but not SENC. Spiral readout gradients are shown as 505. DENSE and SENC apply spatial modulation of magnetization ("SPAMM") preparation after the ECG trigger to encode myocardial displacement and strain, respectively, directly into the imaging signal and acquire images of the stimulated echo at multiple phases of the cardiac cycle. To accelerate the data acquisition, the excitation pulses in the SPAMM module can be modified to be slice-selective in the in-plane directions, meaning selective in X- or Y-directions of the 2D imaging plane, so that the stimulated-echo originates only from the region where the two slice profiles intersect. However, in these methods, another echo, a T1-relaxation echo, is generated during the imaging.

Figure 6A:
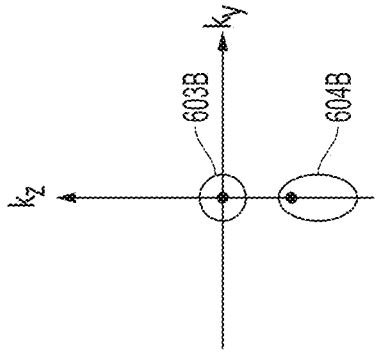
FIG. 6A is an exemplary graph of displacement encoding with through-plane dephasing or through-plane encoding.

Unlike the stimulated echo, the T1-relaxation echo is non-localized and creates artifacts. FIG. 6A is an exemplary graph of displacement encoding with through-plane dephasing or through-plane encoding. The stimulated echo center 601 at the center of the graph, and the T1-relaxation echo center 602 is offset from the stimulated echo center 601 in the positive $K_z$ direction. In DENSE imaging, the T1-relaxation echo can be suppressed by subtracting two phase-cycled acquisitions and applying a through-plane encoding gradient to de-phase the T1-relaxation echo. For SENC imaging, the T1-relaxation echo is partially suppressed in the through-plane direction by using through-plane encoding gradients. Essentially, the T1-relaxation echo is pushed away from the $K_z=0$ center.

Figure 6B:
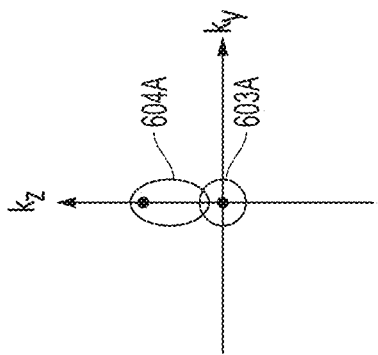
FIG. 6B is an exemplary graph of displacement encoding with local inhomogeneity.

MR imaging utilizes a large magnetic field. While the strength of the magnetic field is known globally, the magnetic field may not be homogeneous throughout the bore of the MRI machine or at precise locations of interest. There may be an inhomogeneity inside the bore itself and at different locations of the human body. For example, the properties of the patient's tissue may have different properties that cause the local inhomogeneity. Further, while in principle the polarity of the through-plane encoding gradients of the MR system do not matter as long as they are consistent between the SPAMM preparation and data acquisition, this may not be the case due to the local inhomogeneity. In fact, application of through-plane encoding gradients may refocus this T1-relaxation echo when a strong local gradient exists due to the field inhomogeneity and the local gradient has a similar amplitude and corresponds in direction with the through-plane encoding gradients used in the imaging sequences. FIG. 6B is an exemplary graph of displacement encoding with through-plane dephasing or through-plane encoding. The T-1 relaxation echo 604A overlaps with the stimulated echo 603A and creates artifacts in the resulting image.

Figure 6C:
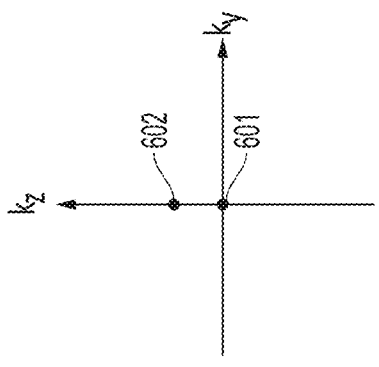
FIG. 6C is an exemplary graph of displacement encoding with local inhomogeneity where the gradient is negated using the systems, methods, or articles described herein.

Therefore, for optimized suppression of the T1-relaxation echoes, one can measure the direction of the local inhomogeneity and the local gradients as prior knowledge. With that information, the direction of the through-plane encoding gradients (the "encoding direction") can be adjusted to correspond with that of the local inhomogeneity (the "inhomogeneity direction"). FIG. 6C is an exemplary graph of displacement encoding with local inhomogeneity where the gradient is negated using the system, methods, or articles described herein. As illustrated in FIG. 6C, the T1-relaxation echo 704B is pushed further in the negative $K_z$ direction. By doing so, the amplitude of the detected T1-relaxation echo in imaging data is significantly reduced.

The potential benefits of the systems, methods, and articles of manufacture are improved image quality and improved robustness to motion for SENC and DENSE techniques. FIG. 1 are figures of SENC with opposite directions of the through-plane encoding gradients, demonstrating the impact of the gradient direction on image quality. These images demonstrate the effects of the through-plane encoding direction with exemplary SENC images. These acquisitions were performed with a localized stimulated echo and a small field-of-view. In the left image (A) in FIG. 1, due to a local inhomogeneity, artifacts (indicated via arrows) are present from the non-localized T1-relaxation echo. The right image (B) in FIG. 1 demonstrates that the artifacts present in the left image (A) can be removed using the techniques described herein. In particular, the artifacts can be removed by negating the through-plane encoding gradients by adjusting the direction of the through-plane encoding gradients to correspond to that of the local inhomogeneity.

Figure 7A:
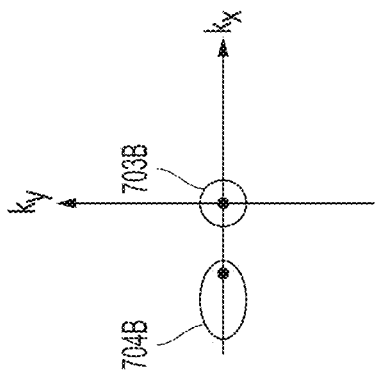
FIG. 7A is an exemplary graph of displacement encoding in the x-direction without local inhomogeneity.
Figure 7B:
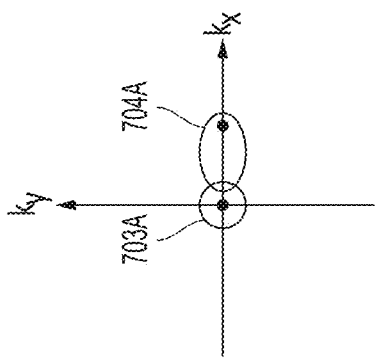
FIG. 7B is an exemplary graph of displacement encoding with local inhomogeneity.
Figure 7C:
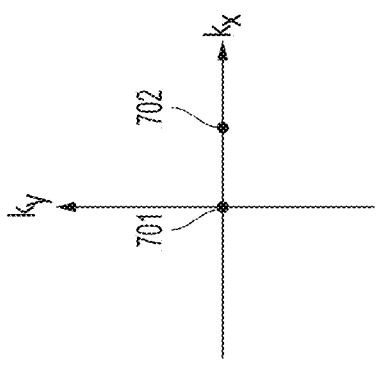
FIG. 7C is an exemplary graph of displacement encoding where the gradient is negated using the systems, methods, or articles described herein.

The systems, methods, and articles described herein may also be helpful to adjust the in-plane encoding directions. FIG. 7A is an exemplary graph of displacement encoding in the x-direction without local inhomogeneity. The stimulated echo center 701 is at the center of the graph. The T1-relaxation echo center 702 is offset from the stimulated echo center 701 in the positive $K_x$ direction. FIG. 7B is an exemplary graph of displacement encoding with local inhomogeneity. The T1-relaxation echo 704A overlaps with the stimulated echo 703A and creates artifacts in the resulting image. FIG. 7C is an exemplary graph of displacement encoding where the gradient is negated using the systems, methods, or articles described herein. As illustrated in FIG. 7C, the T1-relaxation echo 704B is pushed further in the negative $K_x$ direction.

Embodiments of the present subject matter practically apply this discovery and are described below.

Figure 2:
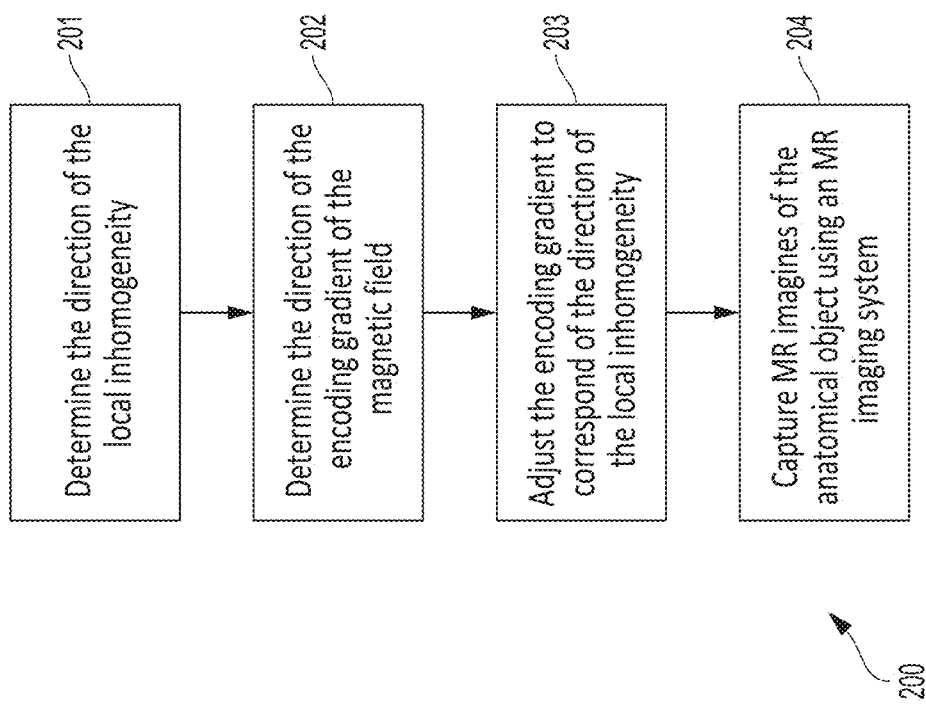
FIG. 2 is a flowchart of an exemplary method of reducing artifact generation echo in stimulated-echo-based strain imaging by adapting the direction of the encoding gradients based on a local inhomogeneity.

Some embodiments are directed to a method for reducing artifact generation echo in stimulated-echo-based strain imaging using MR. FIG. 2 is a flowchart of an exemplary method of reducing artifact generation echo in stimulated-echo-based strain imaging by adapting the direction of the encoding gradients based on the local inhomogeneity of the magnetic field. At 201, the inhomogeneity direction is determined. The inhomogeneity direction is the direction of the local inhomogeneity of a magnetic field at an imaging location of an anatomical object. In some embodiments, the anatomical object is a heart. In some embodiments, this step comprises acquiring a field map of the imaging location to determine the inhomogeneity direction. At 202, the encoding direction is determined. The encoding direction is the direction of the encoding gradient. At 203, the encoding direction is adjusted to correspond with the inhomogeneity direction. At 204, an MR imaging system is used to capture MR images of the anatomical object at the imaging location when the encoding direction corresponds with the inhomogeneity direction. In some embodiments, there is an additional step of calculating strain of the anatomical object at the imaging location using the MR images. In some embodiments, strain is calculated using DENSE imaging or SENC imaging.

Some embodiments are directed to a system for reducing artifact generation echo in stimulated-echo-based strain imaging using MR. The system may comprise one or more computers and an MR imaging system.

The one or more computers may be configured to determine the inhomogeneity direction and the encoding direction. The inhomogeneity direction is the direction of the local inhomogeneity of a magnetic field at an imaging location of an anatomical object. The encoding direction is the direction of the encoding gradient. In some embodiments, the local inhomogeneity is caused by the anatomical object. The one or more computers may be configured to adjust the encoding direction to correspond with the inhomogeneity direction. In some embodiments, the anatomical object is a heart. In some embodiments, the one or more computers may be further configured to determine the inhomogeneity direction by acquiring a field map of the imaging location. In some embodiments, the one or more computers may be further configured to calculate the strain of the anatomical object at the imaging location using the MR images.

The MR imaging system may be configured to capture MR images of the anatomical object at the imaging location. In some embodiments, the MR imaging system utilizes DENSE imaging or SENC imaging. The MR imaging system may have a magnetic field having a local inhomogeneity at the imaging location.

Some embodiments are directed to an article of manufacture. The article may comprise a non-transitory, tangible computer-readable medium holding computer-executable instructions for performing a method for reducing artifact generation echo in stimulated-echo-based strain imaging using MR as described above with respect to FIG. 2.

Figure 3:
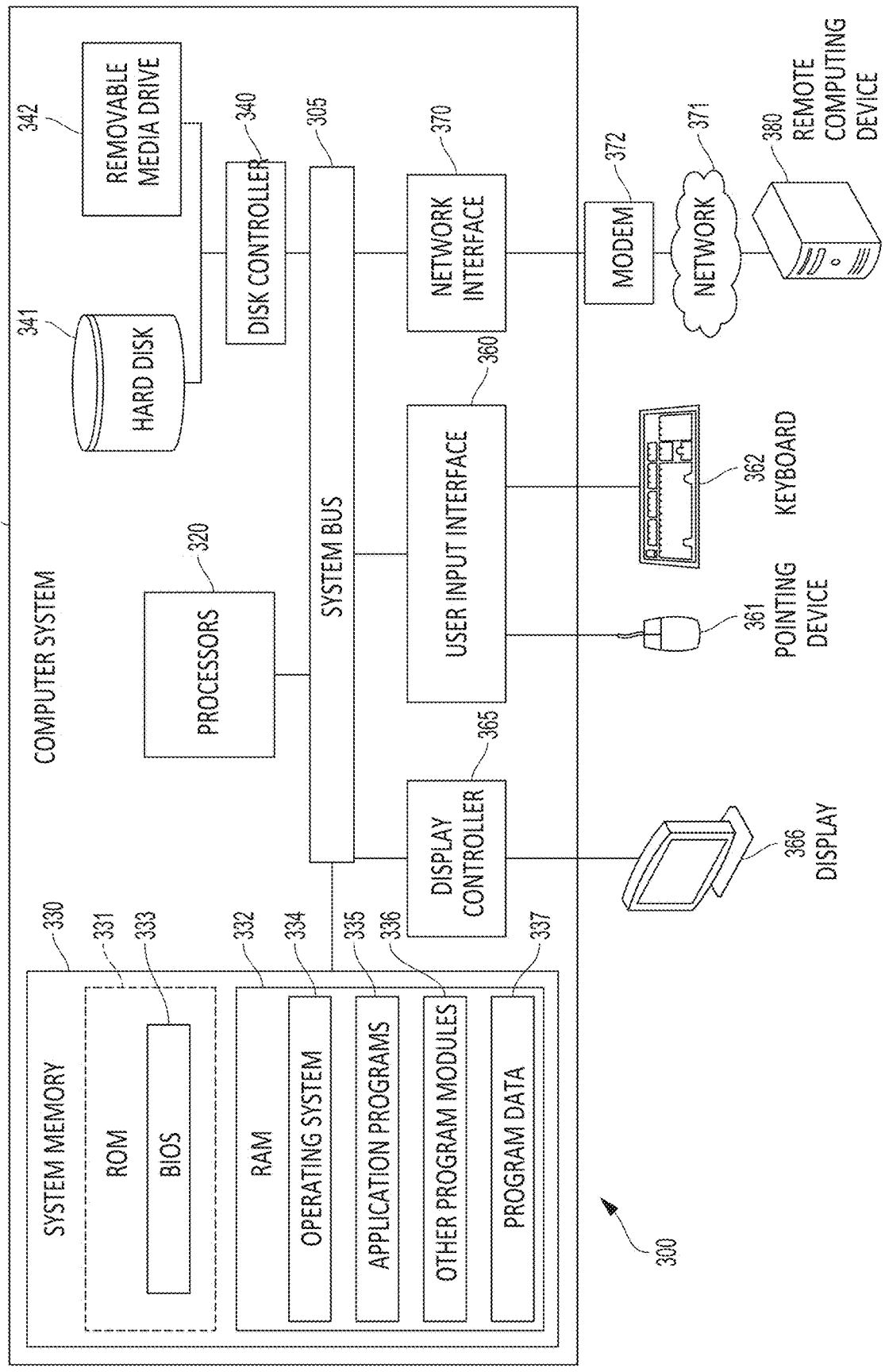
FIG. 3 illustrates an exemplary computing environment within which embodiments of the invention may be implemented.

FIG. 3 illustrates an exemplary computing environment 300 within which embodiments of the disclosed subject matter may be implemented. For example, this computing environment 300 may be configured to execute an imaging process performed by the MR imaging system 400. The computing environment 300 may include computer system 310, which is one example of a computing system upon which embodiments of the disclosed subject matter may be implemented. Computers and computing environments, such as computer system 310 and computing environment 300, are known to those of skill in the art and thus are described briefly here.

As shown in FIG. 3, the computer system 310 may include a communication mechanism such as a bus 305 or other communication mechanism for communicating information within the computer system 310. The computer system 310 further includes one or more processors 320 coupled with the bus 305 for processing the information. The processors 320 may include one or more central processing units, graphical processing units, or any other processor known in the art.

The computer system 310 also includes a system memory 330 coupled to the bus 305 for storing information and instructions to be executed by processors 320. The system memory 330 may include computer readable storage media in the form of volatile and/or nonvolatile memory, such as read only memory (ROM) 331 and/or random access memory (RAM) 332. The system memory RAM 332 may include other dynamic storage device(s) (e.g., dynamic RAM, static RAM, and synchronous DRAM). The system memory ROM 331 may include other static storage device(s) (e.g., programmable ROM, erasable PROM, and electrically erasable PROM). In addition, the system memory 330 may be used for storing temporary variables or other intermediate information during the execution of instructions by the processors 320. A basic input/output system (BIOS) 333 containing the basic routines that help to transfer information between elements within computer system 310, such as during start-up, may be stored in ROM 331. RAM 332 may contain data and/or program modules that are immediately accessible to and/or presently being operated on by the processors 320. System memory 330 may additionally include, for example, operating system 334, application programs 335, other program modules 336 and program data 337.

The computer system 310 also includes a disk controller 340 coupled to the bus 305 to control one or more storage devices for storing information and instructions, such as a hard disk 341 and a removable media drive 342 (e.g., floppy disk drive, compact disc drive, tape drive, and/or solid state drive). The storage devices may be added to the computer system 310 using an appropriate device interface (e.g., a small computer system interface (SCSI), integrated device electronics (IDE), Universal Serial Bus (USB), or FireWire).

The computer system 310 may also include a display controller 365 coupled to the bus 305 to control a display 366, such as a cathode ray tube (CRT) or liquid crystal display (LCD), for displaying information to a computer user. The computer system 310 includes an input interface 360 and one or more input devices, such as a keyboard 362 and a pointing device 361, for interacting with a computer user and providing information to the processor 320. The pointing device 361, for example, may be a mouse, a trackball, or a pointing stick for communicating direction information and command selections to the processor 320 and for controlling cursor movement on the display 366. The display 366 may provide a touch screen interface which allows input to supplement or replace the communication of direction information and command selections by the pointing device 361.

The computer system 310 may perform a portion or all of the processing steps of embodiments of the invention in response to the processors 320 executing one or more sequences of one or more instructions contained in a memory, such as the system memory 330. Such instructions may be read into the system memory 330 from another computer readable medium, such as a hard disk 341 or a removable media drive 342. The hard disk 341 may contain one or more data stores and data files used by embodiments of the present invention. Data store contents and data files may be encrypted to improve security. The processors 320 may also be employed in a multi-processing arrangement to execute the one or more sequences of instructions contained in system memory 330. In alternative embodiments, hardwired circuitry may be used in place of or in combination with software instructions. Thus, embodiments are not limited to any specific combination of hardware circuitry and software.

As stated above, the computer system 310 may include at least one computer readable medium or memory for holding instructions programmed according to embodiments of the disclosed subject matter and for containing data structures, tables, records, or other data described herein. The term "computer readable medium" as used herein refers to any medium that participates in providing instructions to the processor 320 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 341 or removable media drive 342. Non-limiting examples of volatile media include dynamic memory, such as system memory 330. Non-limiting examples of transmission media include coaxial cables, copper wire, and fiber optics, including the wires that make up the bus 305. Transmission media may also take the form of acoustic or light waves, such as those generated during radio wave and infrared data communications.

The computing environment 300 may further include the computer system 310 operating in a networked environment using logical connections to one or more remote computers, such as remote computer 380. Remote computer 380 may be a personal computer (laptop or desktop), a mobile device, a server, a router, a network PC, a peer device or other common network node, and typically includes many or all of the elements described above relative to computer system 310. When used in a networking environment, computer system 310 may include modem 372 for establishing communications over a network 371, such as the Internet. Modem 372 may be connected to bus 305 via user network interface 370, or via another appropriate mechanism.

Network 371 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 310 and other computers (e.g., remote computer 380). The network 371 may be wired, wireless or a combination thereof. Wired connections may be implemented using Ethernet, USB, RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 371.

Figure 4:
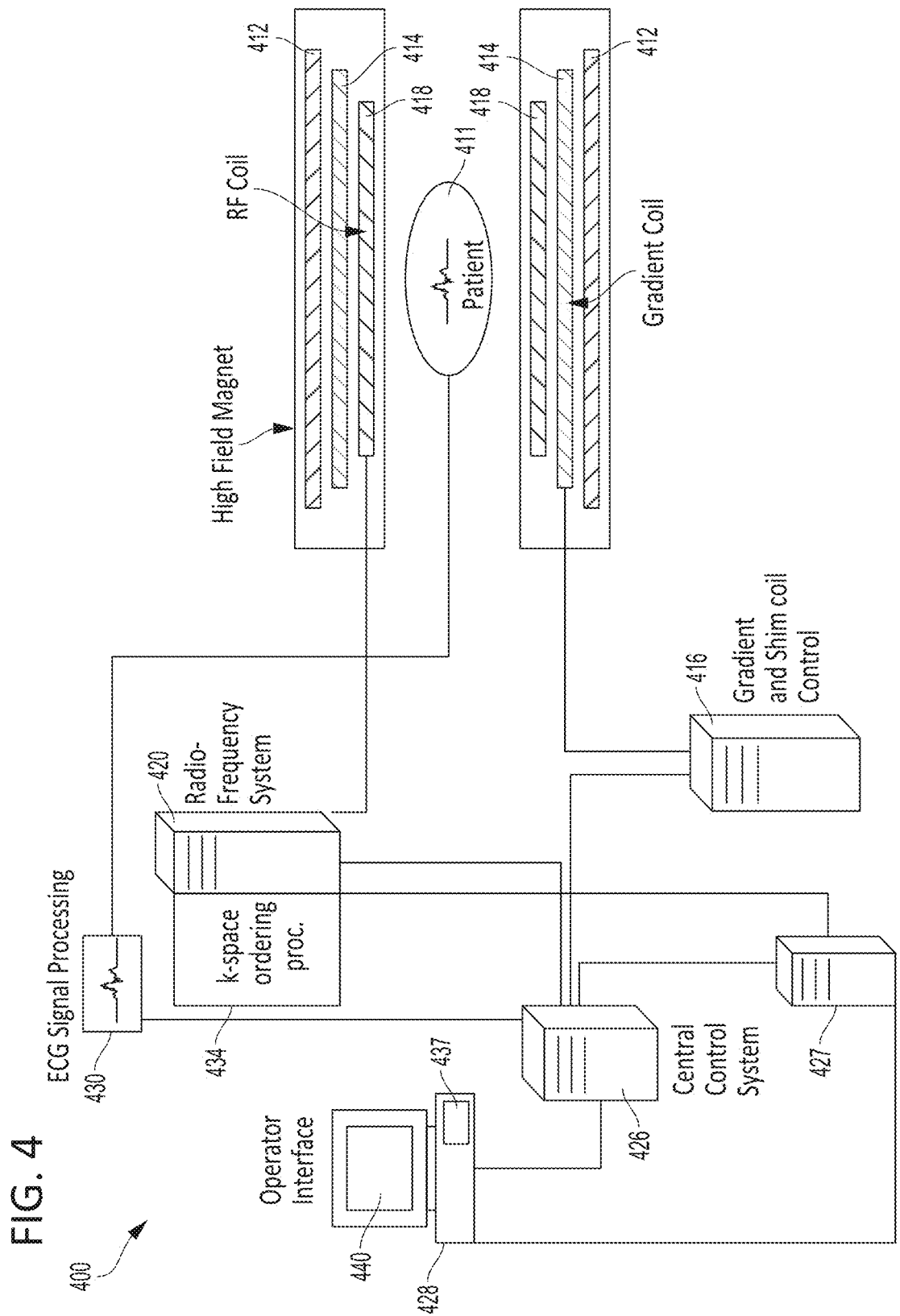
FIG. 4 is a schematic diagram of an exemplary MR imaging system, consistent with disclosed embodiments.

FIG. 4 shows an MR imaging system 400 for ordering acquisition of frequency domain components representing MR imaging data for storage in a k-space storage array, as used by some embodiments of the present invention. In system 400, magnetic coils 412 create a static base magnetic field in the body of patient 411 to be imaged and positioned on a table. Within the magnet system are gradient coils 414 for producing position dependent magnetic field gradients superimposed on the static magnetic field. Gradient coils 414, in response to gradient signals supplied thereto by a gradient and shim coil control module 416, produce position dependent and shimmed magnetic field gradients in three orthogonal directions and generate magnetic field gradient pulses for MR imaging pulse sequences. The shimmed gradients compensate for the inhomogeneity and variability in an MR imaging device magnetic field resulting from patient anatomical variation and other sources. The magnetic field gradients include, for example, a phase-encoding gradient magnetic field that is applied to a selected anatomical area of interest of the patient 411.

A radio frequency (RF) module 420 provides RF pulse signals to RF coil 418 that in response produces magnetic field pulses that rotate the spins of the protons in the imaged body of the patient 411 by ninety degrees or by one hundred and eighty degrees for so-called "spin echo" imaging, or by angles less than or equal to 90 degrees for so-called "gradient echo" imaging. Gradient and shim coil control module 416 in conjunction with RF module 420, as directed by central control system 426, data readout, slice-selection, phase-encoding, readout gradient magnetic fields, radio frequency transmission, and MR signal detection, to acquire MR signals representing planar slices of patient 411.

In response to applied RF pulse signals, the RF coil 418 receives MR signals, i.e., signals from the excited protons within the body as they return to an equilibrium position established by the static and gradient magnetic fields. The MR signals are detected and processed by a detector within RF module 420 and k-space ordering processor unit 434 to provide a MR dataset to an image data processor for processing into an image. In some embodiments, the image data processor is located in central control system 426. However, in other embodiments such as the one depicted in FIG. 4, the image data processor is located in a separate unit 427. Electrocardiogram (ECG) signal processing 430 provides ECG signals used for pulse sequence and imaging synchronization. A two or three dimensional k-space storage array of individual data elements in k-space ordering processor unit 434 stores corresponding individual frequency components comprising a MR dataset. The k-space array of individual data elements has a designated center and individual data elements individually have a radius to the designated center.

A magnetic field generator (comprising coils 412, 414, and 418) generates a magnetic field and a sequence of gradient (coils 414) and RF (coil 418) pulses for use in acquiring multiple individual frequency components corresponding to individual data elements in the storage array. The individual frequency components are successively acquired, for example, using an imaging trajectory with a radial path as described in further detail below. A storage processor in the k-space ordering processor unit 434 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components which is substantially minimized.

Central control system 426 uses information stored in an internal database to process the detected MR signals in a coordinated manner to generate high quality images of a selected slice(s) of the body (e.g., using the image data processor) and adjusts other parameters of system 400. The stored information comprises predetermined pulse sequence and magnetic field gradient and strength data as well as data indicating timing, orientation, and spatial volume of gradient magnetic fields to be applied in imaging. Generated images are presented on display 440 of the operator interface. Computer 428 of the operator interface includes a graphical user interface (GUI) enabling user interaction with central control system 426 and enables user modification of MR imaging signals in substantially real time. Continuing with reference to FIG. 4, display processor 437 processes the MR signals to reconstruct one or more images for presentation on display 440, for example. Various techniques known in the art may be used for reconstruction.

It is understood by those familiar with the art that the system described herein may be implemented in hardware, firmware, or software encoded (e.g., as instructions executable by a processor) on a non-transitory computer-readable storage medium.

While various illustrative embodiments incorporating the principles of the present teachings have been disclosed, the present teachings are not limited to the disclosed embodiments. Instead, this application is intended to cover any variations, uses, or adaptations of the present teachings and use its general principles. Further, this application is intended to cover such departures from the present disclosure that are within known or customary practice in the art to which these teachings pertain.

In the above detailed description, reference is made to the accompanying drawings, which form a part hereof. In the drawings, similar symbols typically identify similar components, unless context dictates otherwise. The illustrative embodiments described in the present disclosure are not meant to be limiting. Other embodiments may be used, and other changes may be made, without departing from the spirit or scope of the subject matter presented herein. It will be readily understood that various features of the present disclosure, as generally described herein, and illustrated in the figures, can be arranged, substituted, combined, separated, and designed in a wide variety of different configurations, all of which are explicitly contemplated herein.

The present disclosure is not to be limited in terms of the particular embodiments described in this application, which are intended as illustrations of various features. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. It is to be understood that this disclosure is not limited to the specific instrumentalities disclosed, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein are generally intended as "open" terms (for example, the term "including" should be interpreted as "including but not limited to," the term "having" should be interpreted as "having at least," the term "includes" should be interpreted as "includes but is not limited to," et cetera). While various methods, systems, and articles of manufacture are described in terms of "comprising" various components or steps (interpreted as meaning "including, but not limited to"), the methods, systems, and articles of manufacture can also "consist essentially of" or "consist of" the various components and steps, and such terminology should be interpreted as defining essentially closed-member groups.

In addition, even if a specific number is explicitly recited, those skilled in the art will recognize that such recitation should be interpreted to mean at least the recited number (for example, the bare recitation of "two recitations," without other modifiers, means at least two recitations, or two or more recitations). Furthermore, in those instances where a convention analogous to "at least one of A, B, and C, et cetera" is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, et cetera). In those instances where a convention analogous to "at least one of A, B, or C, et cetera" is used, in general such a construction is intended in the sense one having skill in the art would understand the convention (for example, "a system having at least one of A, B, or C" would include but not be limited to systems that have A alone, B alone, C alone, A and B together, A and C together, B and C together, and/or A, B, and C together, et cetera). It will be further understood by those within the art that virtually any disjunctive word and/or phrase presenting two or more alternative terms, whether in the description, sample embodiments, or drawings, should be understood to contemplate the possibilities of including one of the terms, either of the terms, or both terms. For example, the phrase "A or B" will be understood to include the possibilities of "A" or "B" or "A and B."

In addition, where features of the disclosure are described in terms of Markush groups, those skilled in the art will recognize that the disclosure is also thereby described in terms of any individual member or subgroup of members of the Markush group.

Various of the above-disclosed and other features and functions, or alternatives thereof, may be combined into many other different systems or applications. Various presently unforeseen or unanticipated alternatives, modifications, variations or improvements therein may be subsequently made by those skilled in the art, each of which is also intended to be encompassed by the disclosed embodiments.

I claim:

1. A method for reducing artifact generation echo in stimulated-echo-based strain imaging using magnetic resonance imaging (MRI), the method comprising:
   determining an inhomogeneity direction, wherein the inhomogeneity direction is a direction of a local inhomogeneity of a magnetic field at an imaging location of an anatomical object;
   determining an encoding direction, wherein the encoding direction is a direction of an encoding gradient;
   adjusting the encoding direction to correspond with the inhomogeneity direction; and
   capturing, via an MRI system, a magnetic resonance image of the anatomical object at the imaging location when the encoding direction corresponds with the inhomogeneity direction.

2. The method of claim 1, wherein the determining the inhomogeneity direction comprises acquiring a field map of the imaging location.

3. The method of claim 1, wherein the anatomical object is a heart.

4. The method of claim 1, further comprising:
   calculating strain of the anatomical object at the imaging location using the magnetic resonance image.

5. The method of claim 4, wherein the calculating the strain of the anatomical object comprises calculating the strain using displacement encoded stimulated imaging.

6. The method of claim 4, wherein the calculating the strain of the anatomical object comprises calculating the strain using strain-encoded imaging.

7. A system for reducing artifact generation echo in stimulated-echo-based strain imaging using magnetic resonance imaging (MRI), the system comprising:
   an MRI system; and
   one or more computers configured to:
      determine an inhomogeneity direction, wherein the inhomogeneity direction is a direction of a local inhomogeneity of a magnetic field at an imaging location of an anatomical object;
      determine an encoding direction, wherein the encoding direction is a direction of an encoding gradient; and
      adjust the encoding direction to correspond with the inhomogeneity direction;
   wherein the MRI system is configured to capture a magnetic resonance image of the anatomical object at the imaging location when the encoding direction corresponds with the inhomogeneity direction.

8. The system of claim 7, wherein the determining the inhomogeneity direction comprises acquiring a field map of the imaging location.

9. The system of claim 7, wherein the MRI system comprises a magnetic field having the local inhomogeneity at the imaging location.

10. The system of claim 7, wherein the local inhomogeneity is caused by the anatomical object.

11. The system of claim 7, wherein the anatomical object is a heart.

12. The system of claim 7, wherein the one or more computers are further configured to:
    calculate a strain of the anatomical object at the imaging location using the magnetic resonance image.

13. The system of claim 12, wherein the calculating the strain of the anatomical object comprises using displacement encoded stimulated imaging.

14. The system of claim 12, wherein the calculating the strain of the anatomical object comprises using strain-encoded imaging.

15. An article of manufacture for reducing artifact generation echo in stimulated-echo-based strain imaging using magnetic resonance, the article of manufacture comprising a non-transitory, tangible computer-readable medium holding computer-executable instructions for performing a method comprising:
    determining an inhomogeneity direction, wherein the inhomogeneity direction is a direction of a local inhomogeneity of a magnetic field at an imaging location of an anatomical object;
    determining an encoding direction, wherein the encoding direction is a direction of an encoding gradient;
    adjusting the encoding direction to correspond with the inhomogeneity direction; and
    using an MRI system to capture a magnetic resonance image of the anatomical object at the imaging location when the encoding direction corresponds with the inhomogeneity direction.

16. The article of manufacture of claim 15, wherein the determining the inhomogeneity direction comprises acquiring a field map of the imaging location.

17. The article of manufacture of claim 15, wherein the anatomical object is a heart.

18. The article of manufacture of claim 15, wherein the method further comprises:
    calculating a strain of the anatomical object at the imaging location using the magnetic resonance image.

19. The article of manufacture of claim 18, wherein calculating the strain of the anatomical object comprises using displacement encoded stimulated imaging.

20. The article of manufacture of claim 18, wherein calculating the strain of the anatomical object comprises using strain-encoded imaging.

* * * * *